(12) United States Patent
Parekh et al.

(10) Patent No.: US 6,468,859 B1
(45) Date of Patent: Oct. 22, 2002

(54) METHOD OF REDUCING ELECTRICAL SHORTS FROM THE BIT LINE TO THE CELL PLATE

(75) Inventors: Kunal R. Parekh, Boise; Charles H. Dennison, Meridian; Jeffrey W. Honeycutt, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/399,592

(22) Filed: Sep. 20, 1999

(51) Int. Cl.⁷ .......................................... H01L 21/8242
(52) U.S. Cl. ................... 438/255; 438/253; 438/254; 438/256; 438/396; 438/397; 438/398; 438/399; 438/964
(58) Field of Search ................... 438/253–256, 438/396–399, 964

(56) References Cited

U.S. PATENT DOCUMENTS

| | | | |
|---|---|---|---|
| 5,338,700 A | 8/1994 | Dennison et al. | 437/60 |
| 5,563,089 A | 10/1996 | Jost et al. | 437/60 |
| 5,686,747 A | 11/1997 | Jost et al. | 257/296 |
| 5,763,306 A | 6/1998 | Tsai | |
| 5,821,140 A | 10/1998 | Jost et al. | 438/241 |
| 5,946,568 A * | 8/1999 | Hsiao et al. | 438/253 |
| 6,124,626 A | 9/2000 | Sandhu et al. | |
| 6,200,855 B1 * | 3/2001 | Lee | 438/255 |
| 6,274,423 B1 | 8/2001 | Prall et al. | |

* cited by examiner

Primary Examiner—John F. Niebling
Assistant Examiner—Jennifer M. Kennedy
(74) Attorney, Agent, or Firm—TraskBritt

(57) ABSTRACT

A stress buffer and dopant barrier in the form of a Tetra-EthylOrthoSilicate (TEOS) film is deposited after the capacitor cell plate has been etched and cleaned to thereby eliminate electrical shorts from the bit line to the cell plate.

20 Claims, 10 Drawing Sheets

METHOD OF REDUCING ELECTRICAL SHORTS FROM THE BIT LINE TO THE CELL PLATE

TECHNICAL FIELD OF THE INVENTION

This invention relates to generally to the formation of a bit line over capacitor array of memory cells.

BACKGROUND OF THE INVENTION

This invention was principally motivated in addressing problems and improvements in dynamic random access memory (DRAM). As DRAM increases in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics, as well as the cell structure, are important.

Conventional stacked capacitor DRAM arrays utilize either a Capacitor Over Bit line (COB) or a Capacitor Under Bit line (CUB) construction. With a Capacitor Over Bit line construction, the bit line is provided in close vertical proximity to the bit line contact of the memory cell field effect transistor (FET), with the cell capacitors being formed over the top of the word line and bit line. With a Capacitor Under Bit line construction, a deep vertical bit line contact is made through a thick insulating layer to the source/drain region of the cell FET access transistor, with the capacitor construction being provided over the word line and under the bit line.

The present invention relates to a method of reducing electrical shorts between the bit contact and the capacitor cell plate in a Capacitor Under Bit line cell.

SUMMARY OF THE INVENTION

The process of the present invention provides a method to prevent a short circuit between a capacitor cell plate and a conductive contact. The present invention provides for a capacitor structure having lower and upper conductive cell plates. The conductive cell plates are separated by a dielectric, and the conductive cell plates and the dielectric have exposed edges. A layer of TEOS is disposed upon the wafer and about the capacitor structure. The TEOS layer encases the exposed edges of the conductive cell plates. A conductive contact structure is then provided adjacent the capacitor structure. The TEOS layer separates the capacitor structure and the conductive contact structure, thereby preventing the conductive structures from shorting together.

BRIEF DESCRIPTION OF THE DRAWING(S)

The present invention will be better understood from reading the following description of nonlimitative embodiments, with reference to the attached drawings, wherein below:

DETAILED DESCRIPTION OF THE PREFERRED EMBODIMENT(S)

FIGS. 1–10 illustrate a technique for eliminating electrical shorts in a semiconductor device. It should be understood that the illustrations are not meant to be actual cross-sectional views of any particular semiconductor device, but are merely idealized representations which are employed to more clearly and fully depict the formation of the process of the present invention than would otherwise be possible.

Figure 1:
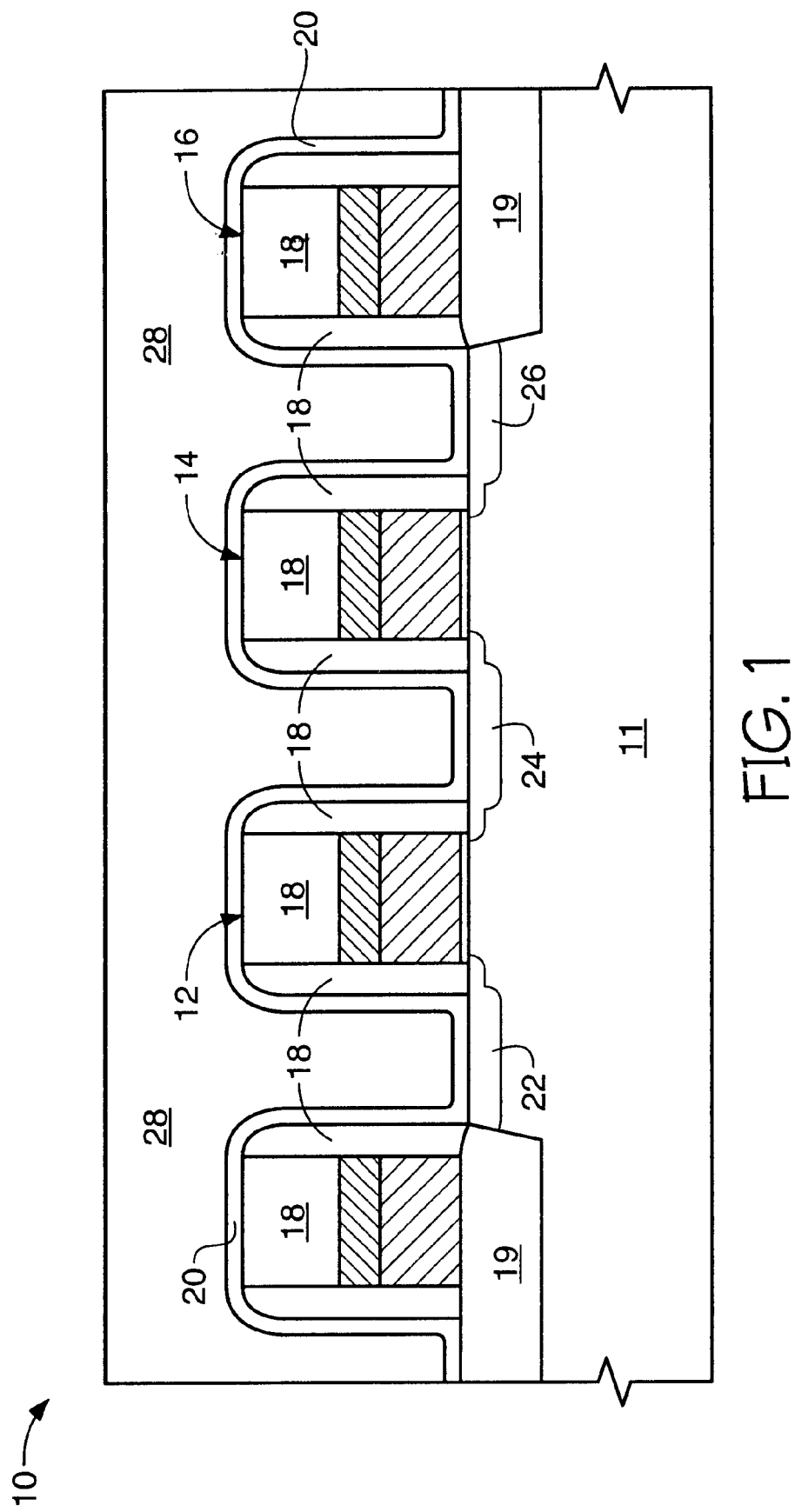
FIG. 1 is a schematic cross-section of a semiconductor wafer fragment, in accordance with the process of the present invention.

Referring to FIG. 1, a semiconductor wafer fragment is indicated generally by reference numeral 10. Wafer 10 is defined in part by a silicon semiconductor substrate 11. In the semiconductor industry, a "substrate" refers to one or more semiconductor layers or structures, which includes active or operable portions of semiconductor devices. In the context of this document, the term "semiconductor substrate" is defined to mean any construction comprising semiconductive material, including but not limited to bulk semiconductive material, such as a semiconductive substrate, either alone or in assemblies comprising other materials thereon, and semiconductive material layers, either alone or in assemblies comprising other materials. The term "substrate" refers to any supporting structure including, but not limited to the semiconductive substrates described above.

Wafer 10 has been provided with an array of substantially electrically isolated word lines, such as the illustrated word lines 12, 14, and 16. Such word lines are of a conventional construction having a lowermost gate oxide, a lower polysilicon layer, an overlying silicide layer such as tungsten silicide, and insulating caps and side insulating spacers 18.

Such spacers and caps 18 preferably comprise an insulative nitride, such as $Si_3N_4$. A thin layer 20 of $Si_3N_4$ or Tetra-EthylOrthoSilicate (TEOS) is provided atop the wafer to function as a diffusion barrier for subsequent BoroPhosoSilicate Glass (BPSG) deposition. Layer 20 has a thickness preferably from about 100 Angstroms to about 250 Angstroms.

Active areas are provided about the word lines, such as active regions 22, 24, and 26, to define an array of memory cell FETs. The discussion proceeds with reference to FETs formed using word lines 12 and 14, which would be provided with a capacitor construction for definition of two memory cells which share the same bit line contact. Active regions 22 and 26 define first active regions for electrical connection with a memory cell capacitor (described below). Active region 24 defines a second active region for electrical connection with a bit line (described below). Field oxide 19 is provided, as shown.

A first insulating layer 28 is provided over the word lines and active areas. An example material is BoroPhosoSilicate glass (BPSG), with an example deposition thickness being between 15,000 and 20,000 Angstroms. Preferably, as shown, layer 28 is subsequently planarized by chemical-mechanical polishing (CMP) to an elevation of from about 2,000 Angstroms to about 8,000 Angstroms above the word line nitride caps 18.

Figure 2:
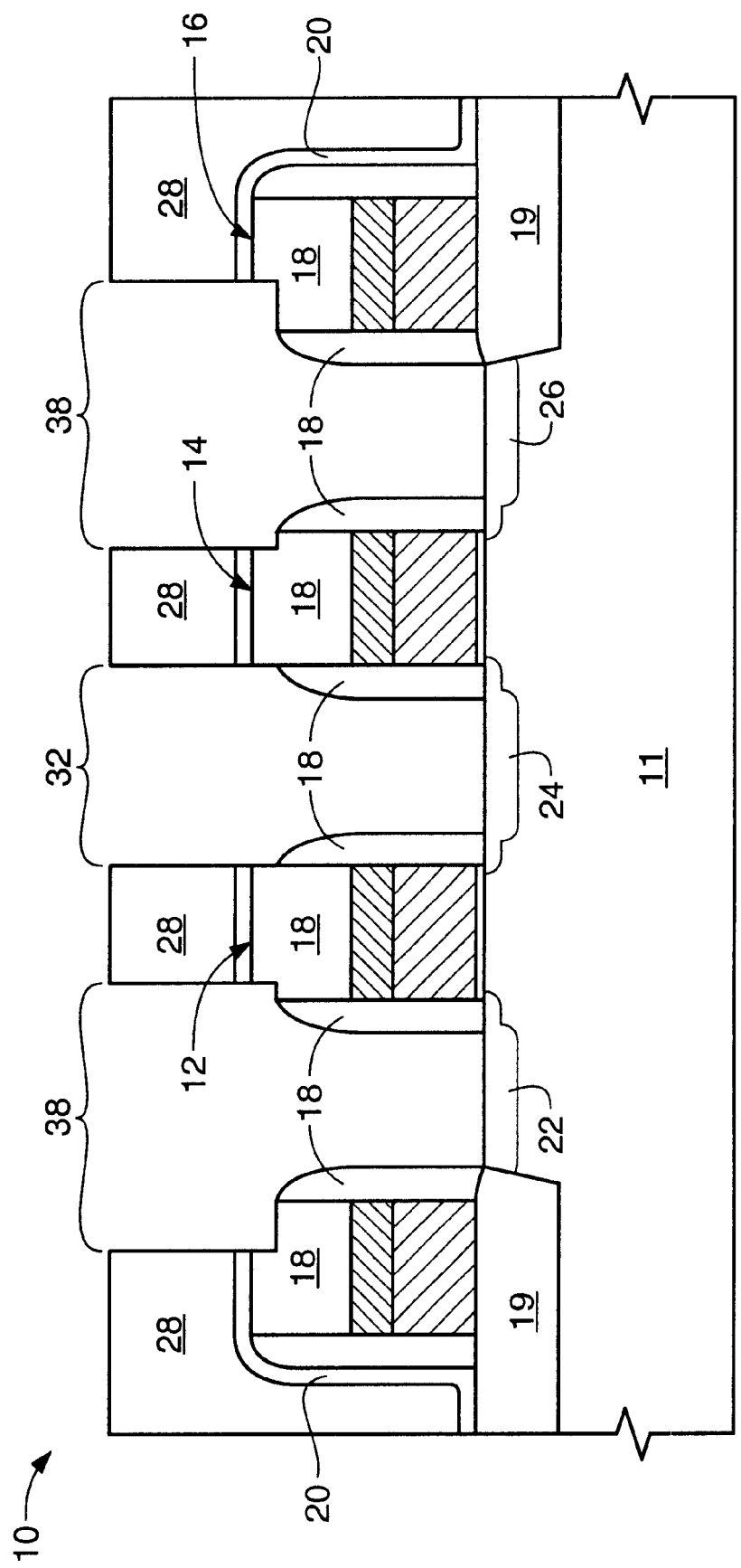
FIG. 2 is a schematic cross-section of the semiconductor wafer fragment, in accordance with the process of the present invention.

Referring to FIG. 2, a series of first contact openings 38 and second contact openings 32 are provided through first layer 28 to first active regions 22 and 26, and second active region 24, respectively. Photomasking and dry chemical etching of BPSG selectively relative to nitride would typically form such contact openings. An example etch chemistry would include $CHF_3$ and $O_2$ and at low $O_2$ flow rate (i.e., less than 5% $O_2$ by volume in a $CHF_3/O_2$ mixture), or the combination of $CF_4$, Argon, $CH_2F_2$ and $CHF_3$.

Thereafter, an etch of the wafer is conducted to etch nitride layer 20 or TEOS selectively relative to underlying silicon substrate 11 to upwardly expose active regions 22 and 26 and 24. The principal purpose of barrier layer 20 is to prevent diffusion of boron or phosphorous atoms from BPSG layer 28 into active areas 24 and 22 and 26. Caps 18 are preferably comprised of a nitride ($Si_3N_4$) and layer 28 comprised of an oxide, such that the contact etch to produce contacts 32 and 38 will stop relative to word line spacers and caps 18.

Figure 3:
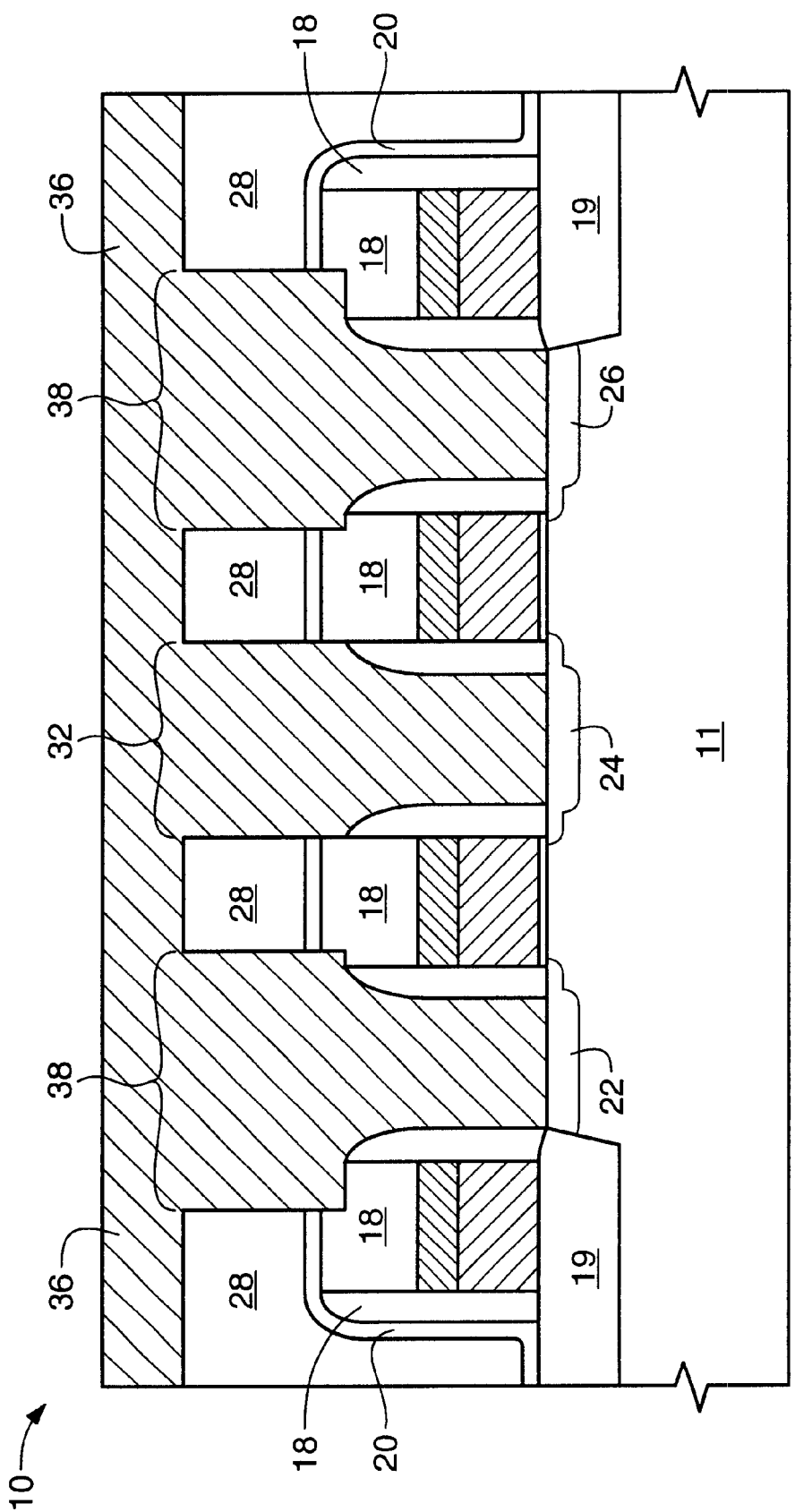
FIG. 3 is a schematic cross-section of the semiconductor wafer fragment, in accordance with the process of the present invention.
Figure 4:
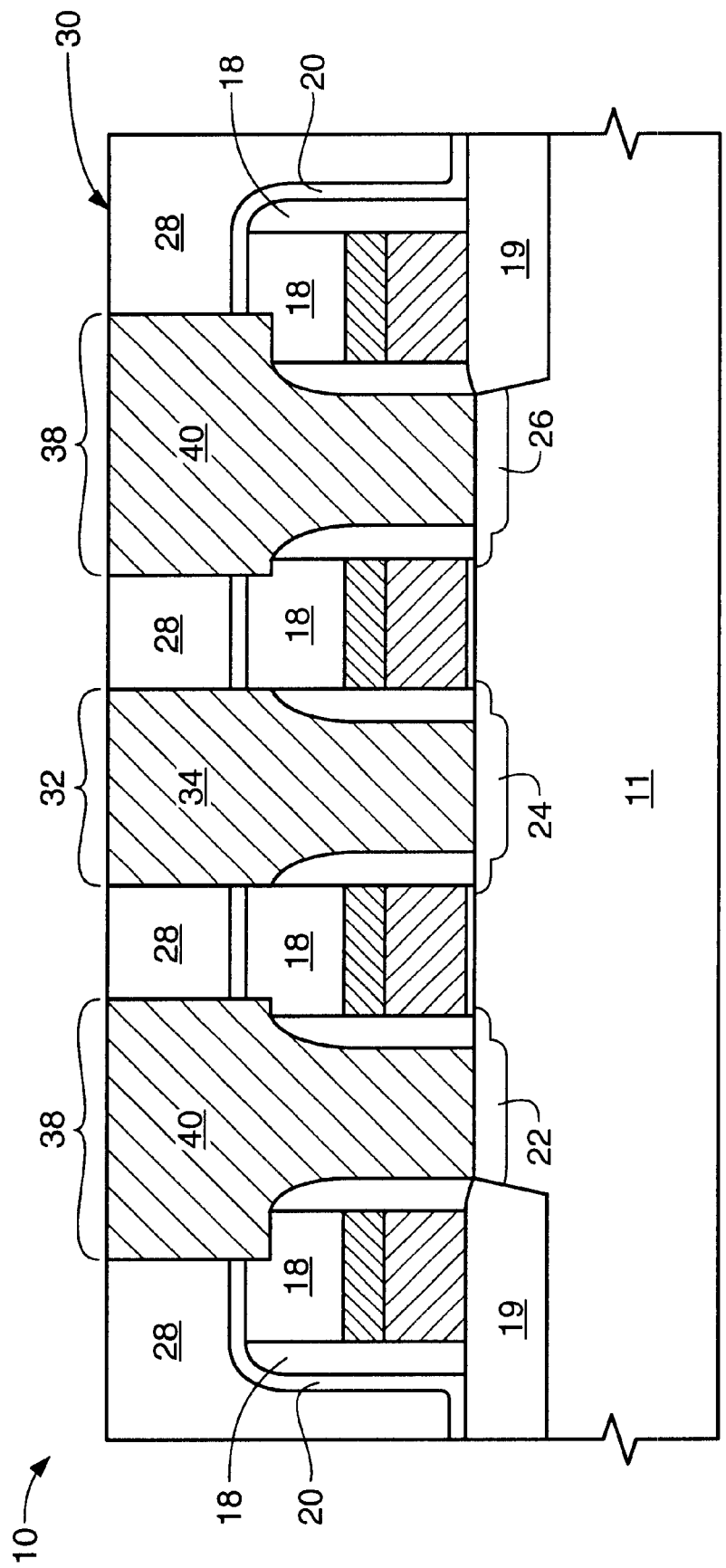
FIG. 4 is a schematic cross-section of the semiconductor wafer fragment, in accordance with the process of the present invention.

In accordance with the invention, buried capacitor contacts openings/containers 38 and associated pillars 40 can be provided along with the bit line contacts openings 32 and pillars 34, as seen in FIGS. 3 and 4. A first layer of electrically conductive material 36 is provided over insulating material layer 28 to within second contact opening 32 and first contact opening 38 to electrically connect with first and second active regions 22, 26 and 24, respectively. First layer 36 is deposited to a thickness which fills second contact opening 32 and first contact opening 38. An example diameter for contact openings 32 and 38 is 0.2–0.25 micron. In such instance, an example preferred thickness of first layer 36 is less than 2000 Angstroms, which is sufficient to fill the contact openings 32, 38. An example and preferred material for first layer 36 is in situ N+ doped polysilicon.

Wafer fragment 10 is planarized and etched downwardly at least to upper surface 30 of insulating material 28 to remove conductive material layer 36 there above. This will isolate first layer conductive material 36 within contact openings 32 and 38. Such planarized etching can be conducted by plasma etchback, or by chemical-mechanical polishing.

Figure 5:
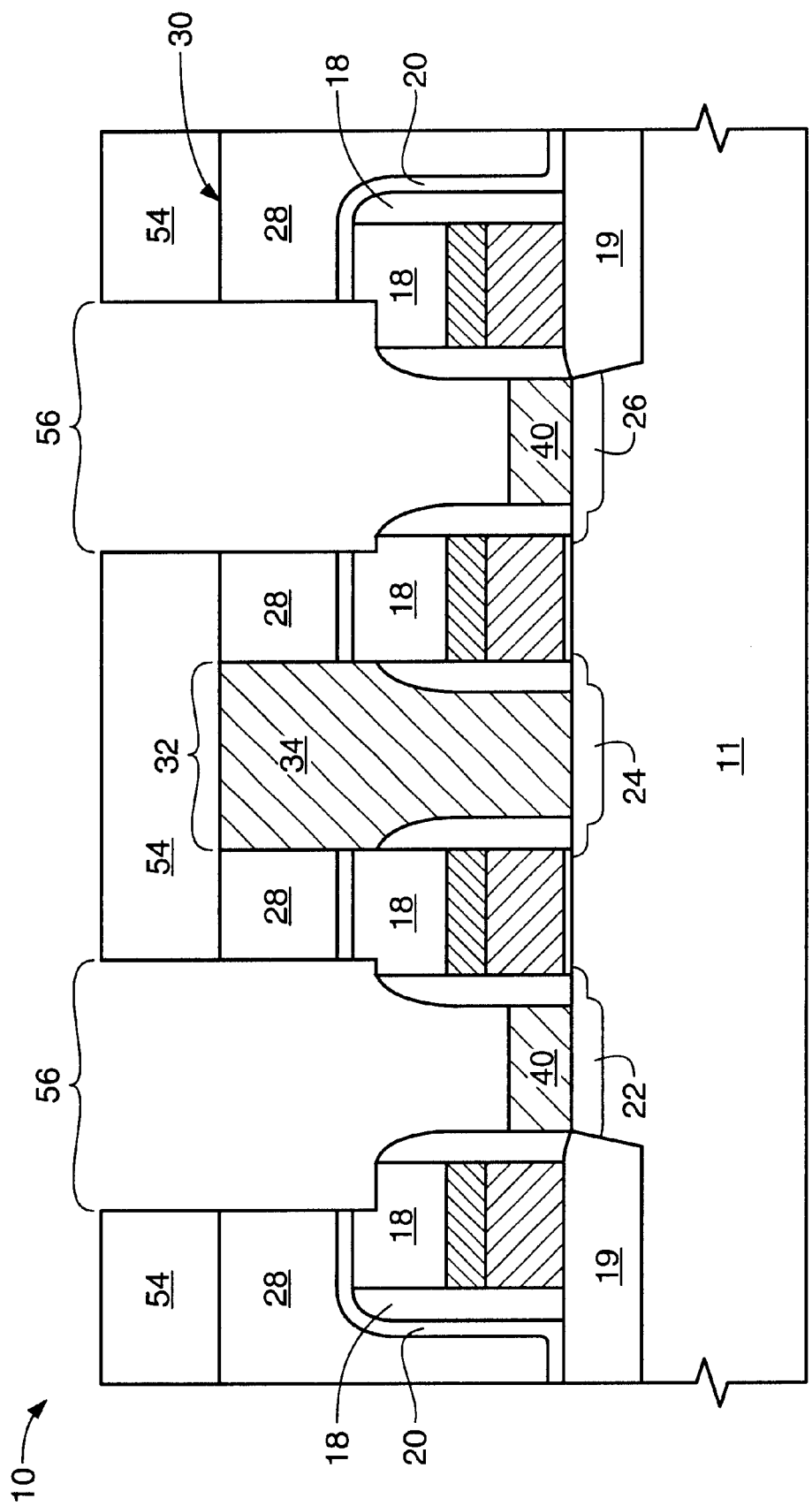
FIG. 5 is a schematic cross-section of the semiconductor wafer fragment, in accordance with the process of the present invention.

Referring to FIG. 5, the conductive material layer 36 within first contact opening 38 can be recessed further, to a level below upper surface 30 of insulating layer 28. A capacitor structure is formed at this location, as discussed below.

A layer of insulating material 54 is provided atop wafer 10. An example and preferred material for layer 54 is BPSG deposited to a thickness of approximately 10,000 Angstroms. Capacitor contact openings 56 are provided through layer 54 to allow electrical connection with first active regions 22 and 26, through pillars 40.

Figure 6:
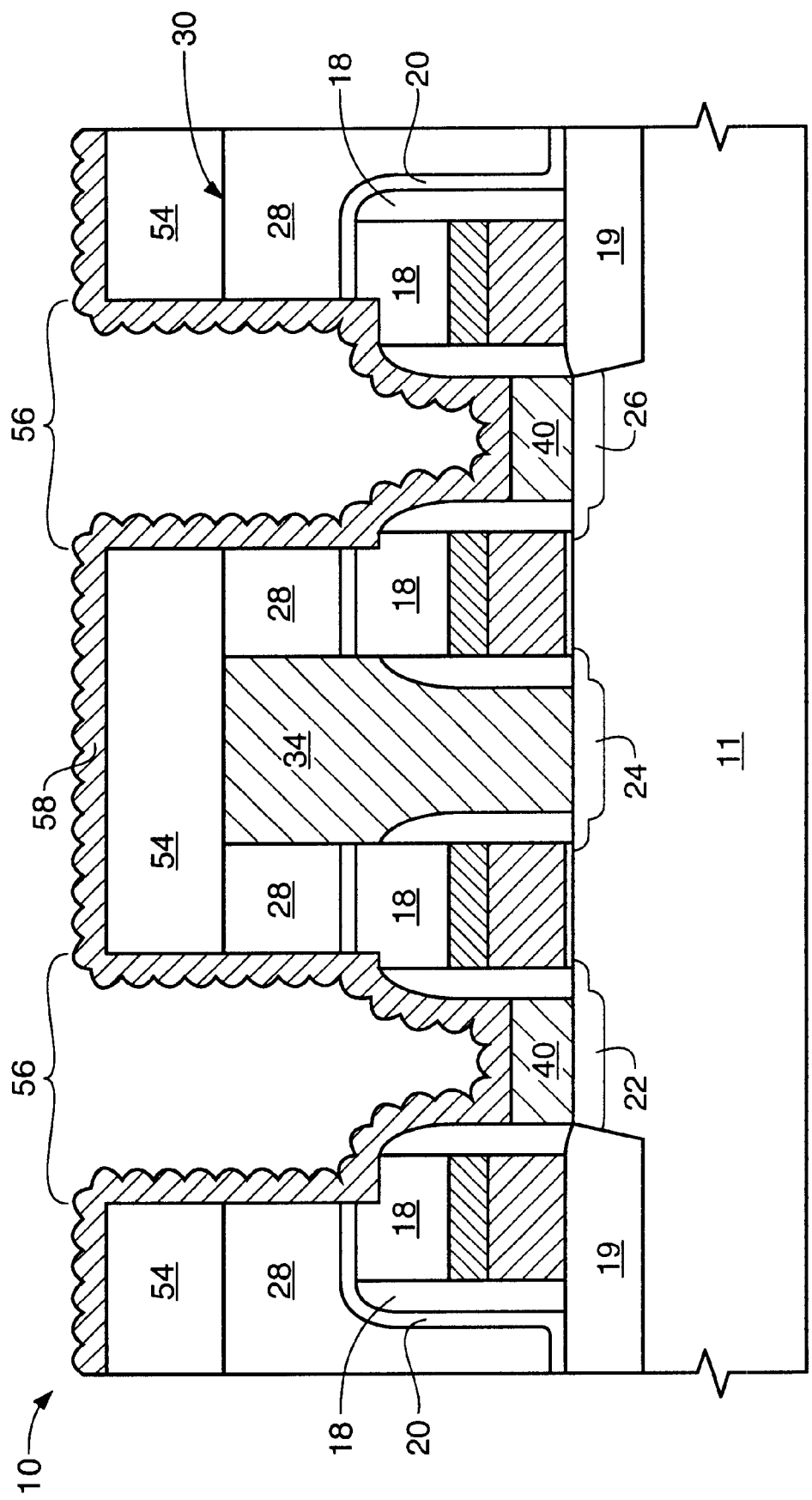
FIG. 6 is a schematic cross-section of the semiconductor wafer fragment, in accordance with the process of the present invention.

Referring to FIG. 6, a conductive material layer 58 is provided over insulating layer 54, and within capacitor contact opening 56. Conductive layer 58 preferably comprises in situ Phosphorous-doped HemiSpherical Grain (HSG) polysilicon.

Figure 7:
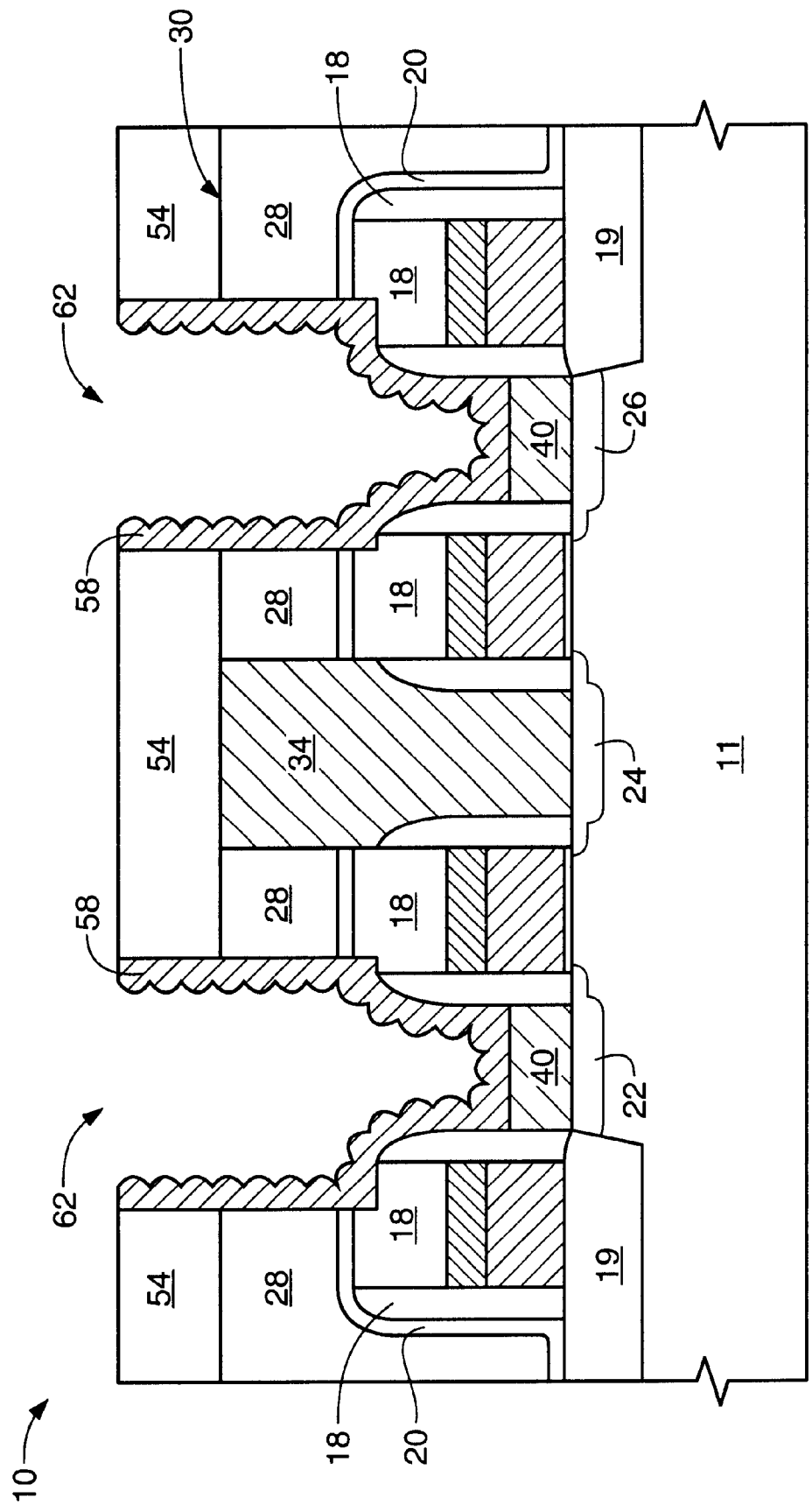
FIG. 7 is a schematic cross-section of the semiconductor wafer fragment, in accordance with the process of the present invention.

Referring to FIG. 7, CMP is preferably used to remove the conductive material layer 58 which is disposed atop insulating layer 54, thereby defining isolated storage node containers 62. The storage node containers 62 are electrically connected to first active regions 22 and 26 through pillars 40.

Figure 8:
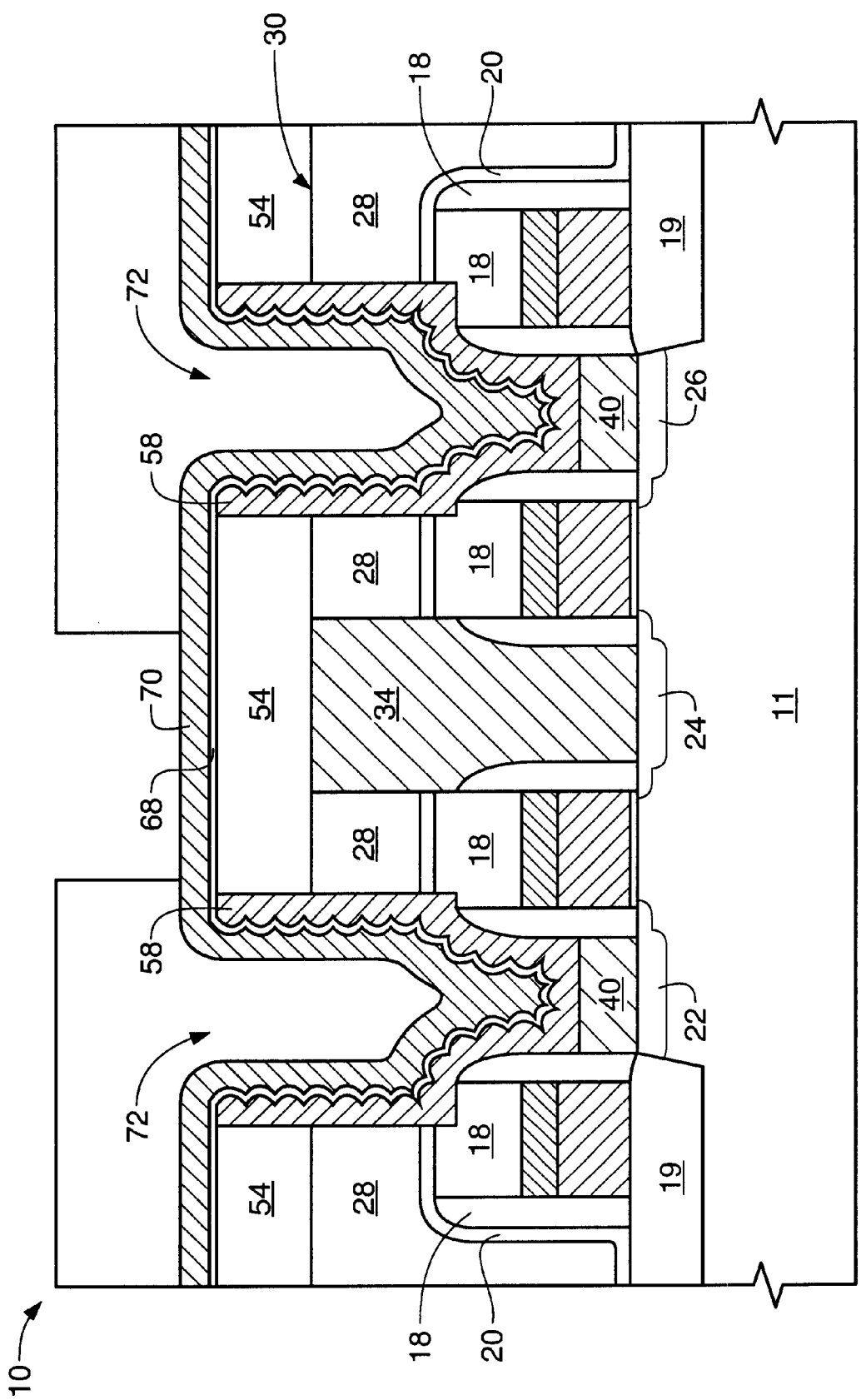
FIG. 8 is a schematic cross-section of the semiconductor wafer fragment, in accordance with the process of the present invention.

Referring to FIG. 8, a conventional or other suitable capacitor cell dielectric layer 68 is conformally deposited on the wafer 10 atop isolated storage node containers 62. Specifically, insulating layer 54 is interposed between the upper surface 36 of first pillar 34 and the capacitor cell dielectric 68.

A conductive capacitor cell layer 70 is provided atop the capacitor cell dielectric layer 68, thereby defining an array of memory cell capacitors 72 on the wafer 10. Individual memory cell capacitors, such as the illustrated capacitors 72, of the array are thus provided within the capacitor contact openings, and are defined by an outwardly projecting container structure. Layer 70 preferably comprises in situ Phosphorous-doped polysilicon, and functions as a capacitor cell plate.

Capacitor cell plate layer 70 is then photopatterned with a layer of resist, which is intentionally illustrated herein with misalignment to account for the worst case scenario in a manufacturing environment The misalignment will make the benefits of the present invention more apparent. Alternatively, an anti-reflective coating is added prior to photopatterning to assist in photolithography resolution. Subsequently layers 68 and 70 are etched together.

Figure 9:
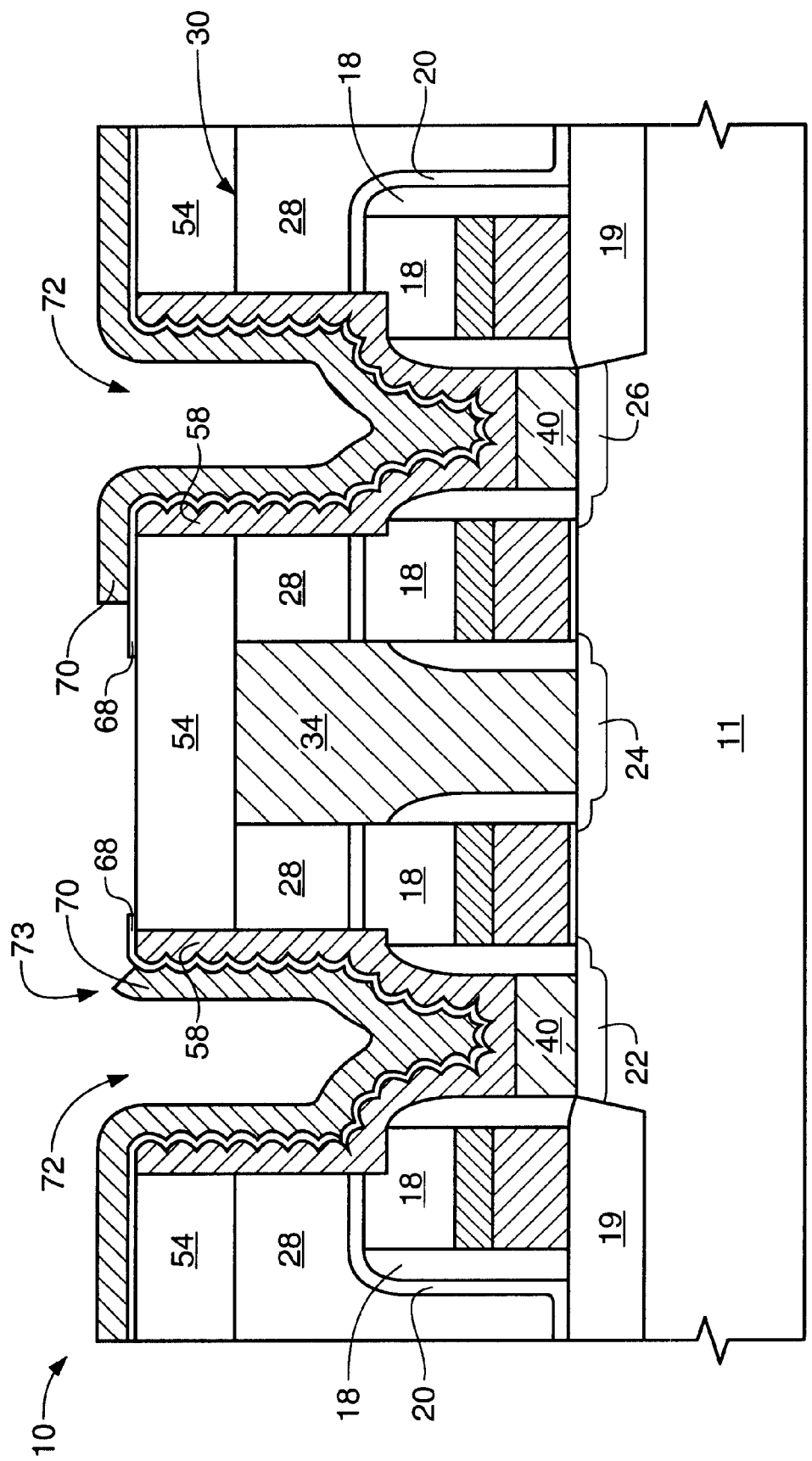
FIG. 9 is a schematic cross-section of the semiconductor wafer fragment, in accordance with the process of the present invention.

The etch of the cell layer 70 has an isotropic component, i.e., the etch proceeds in both horizontal and vertical directions at relatively the same rate. The polysilicon layer that comprises cell layer 70 is selectively etchable with respect to the cell nitride layer 68. Hence, the cell nitride layer 68 is not etched at the same rate, and an overetch of the cell layer 70 results in an undercut profile. One consequence of the undercut of cell layer 70 is that, with a worst case scenario, photolithography may result in a misalignment edge 73, as seen in FIG. 9, wherein the cell layer 70 is isotropically etched back past the upper edge of the conductive material layer 58.

Figure 10:
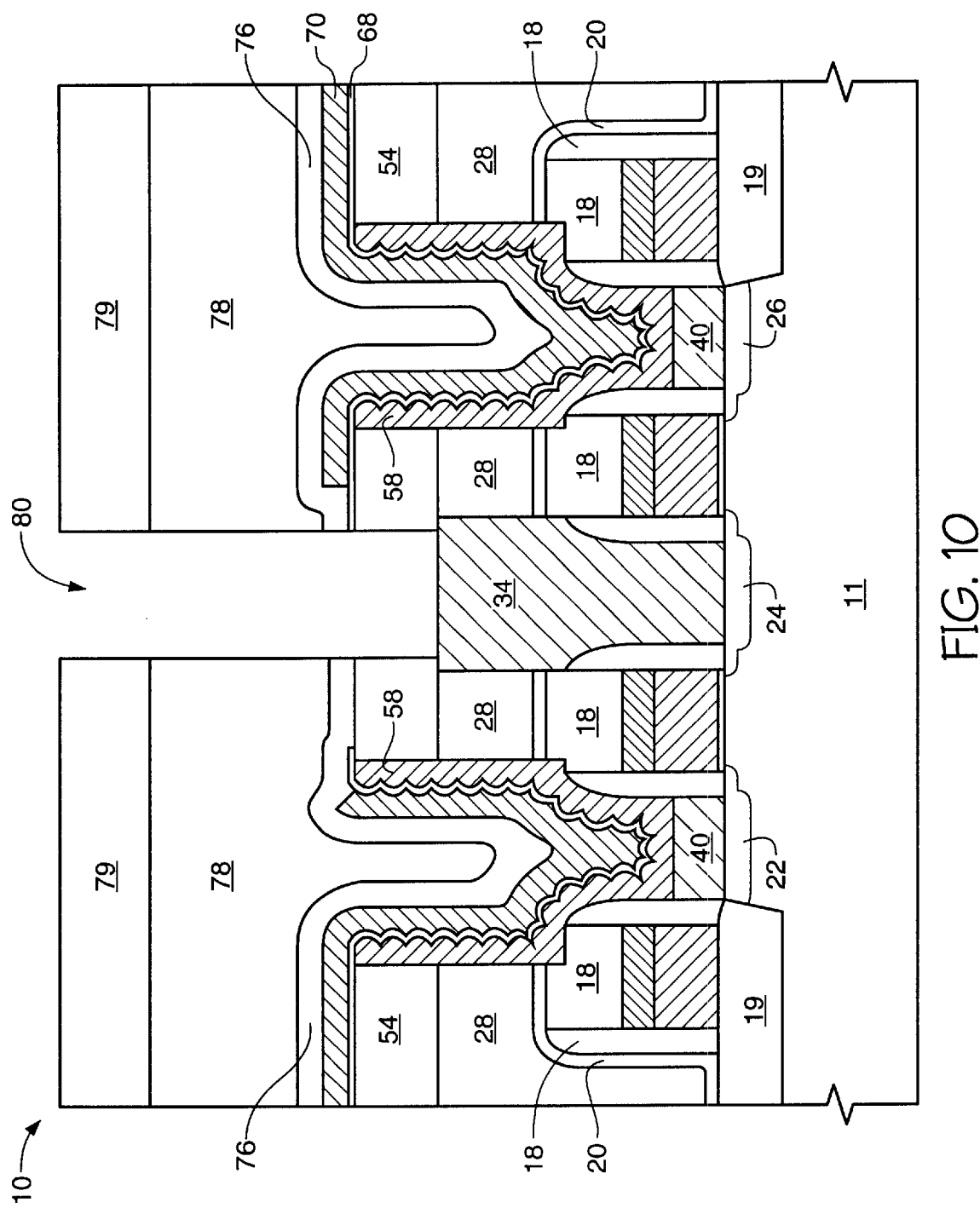
FIG. 10 is a schematic cross-section of the semiconductor wafer fragment, in accordance with the process of the present invention.

One reason for undercutting into the cell layer 70 is to provide more of a process margin for the future bit line contact opening 80, as shown in FIG. 10. The undercut profile helps to prevent the conductive polysilicon which forms cell layer 70 from projecting into the bit line contact opening 80 and thereby causing a short. This potential short is an increasing problem as the geometries of the DRAM cell become smaller and smaller. Therefore, one advantage of this step is an increased bit line contact opening 80 to cell layer 70 space and hence, a method to isolate the conductive edges of cell layer 70.

However, the corresponding disadvantage is that the cell plate 70 is etched passed the storage container polysilicon 58, which leads to a low level defect density of current leakage between the storage node 58 and cell plate layer 70 at the exposed edge 73. This current leakage results in loss of stored charge in the DRAM cell, which lead to data retention errors. Additionally, the loss of stored charge may be aggravated by possible damage of the exposed cell nitride 68 in the etched region 73.

An electrically insulative layer 76, such as TEOS, is blanket deposited atop the wafer 10 (and therefore covers cell capacitor layer 70) to a thickness from about 150 Angstroms to about 1500 Angstroms, preferably 500 Angstroms. The purpose of such a layer 76 is to cover both the exposed corner of the storage container polysilicon 58 and any damaged nitride layer 68. Further, the blanket TEOS film 76 is superior to the use of a nitride film as it also allows hydrogen to diffuse through it, and consequently, does not prevent passivation by hydrogen of the FETs during alloy.

Continuing the process flow, a layer of insulating material 78 overlays the barrier layer 76 and underlying layers and capacitor structures 72. Layer 78 is preferably comprised of BPSG. Alternatively, a deposited anti-reflective coating (not shown) may be added atop the BPSG for increased photolithography resolution. The wafer 10 is coated with a layer of resist 79 and patterned.

Referring to FIG. 10, preliminary bit line contact openings 80 are provided through overlying layer 78, and TEOS layer 76 and second BPSG layer 54 down to the polysilicon plug 34. The anisotropic plasma etch used to produce contact opening 80 is followed by a pre-metal clean, also known as a wet etch as oxide material is isotropically removed. The pre-metal clean/wet etch removes any anti-reflective coating (DARC) remaining on the top surface of the BPSG, and cleans the bottom of the contact opening 80.

Typically, the process incidentally would move out laterally when the wet etch process hits the cell nitride layer 68. However, the TEOS film 76 deposited atop of the wafer 10 after the cell plate 70 has been etched, serves to substantially eliminate any preferential wet etching along the seam of the nitride 68 and BPSG 78, which would occur if the TEOS film 76 had not been deposited.

Without the TEOS layer 76, when the pre-metal clean/wet etch hits the cell nitride 68, an enhanced etch rate would occur along interface with the BPSG 78. This enhanced etch rate is due to stress and dopant "pile-up" from the BPSG layer 78 and out diffusion from the heavily doped exposed cell polysilicon 70. Higher out-diffusion and higher phosphorous concentration from the exposed cell plate 70 leads to an enhanced wet etch rate. This will be exacerbated by subsequent wet cleans prior to contact metal deposition, which can ultimately lead to bit contact to cell plate 70 shorts.

The presence of the TEOS layer 76 moves the stress away from the nitride/BPSG interface to the TEOS/BPSG interface. The result is that the cell polycrystalline silicon 70 is no longer exposed during the pre-metal clean/wet etch. The TEOS film 76 prevents dopant mixing or "pile up" (an increase in the concentration of dopants in a particular location). Thus, the layer 76 provides a stress buffer and dopant barrier in the form of a TEOS film that is deposited after the capacitor cell plate 70 is etched and cleaned.

The addition of a TEOS film 76 buffers the stress as well as eliminates dopant mixing between the highly phosphorous doped polycrystalline silicon forming the capacitor cell plate 70 and the heavily doped BPSG glass 78, and therefore provides a method of reducing stress induced wet etching along BPSG/nitride interface in a DRAM capacitor to eliminate bit contact to cell plate 70 shorting.

Subsequently, a digit line layer, such as metal or conductively doped polysilicon, is provided atop the wafer 10 and within the complete bit line contact openings 80, and thus electrically connects with first pillar 34 for establishing electrical connection with active regions 24.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

One having ordinary skill in the art will realize that even though a DRAM was used as the illustrative example, the process is equally applicable to other semiconductor devices.

What is claimed is:

1. A method of limiting enhanced lateral etching during wet etching, comprising:
   providing a capacitor structure disposed on a semiconductor substrate, said capacitor structure comprising a first doped conductive layer, a dielectric layer atop said first doped conductive layer, and a second doped conductive layer atop said dielectric layer;
   blanketing said capacitor structure with an insulative material comprising TEOS;
   layering said semiconductor substrate with a heavily doped dielectric material, wherein the dielectric layer extends beyond the second doped conductive layer; and
   patterning and etching a vertical opening adjacent said capacitor structure and through said doped dielectric material and said insulative material.

2. The method of limiting enhanced lateral etching according to claim 1, wherein said providing said capacitor structure comprises providing a container-shaped capacitor.

3. The method of limiting enhanced lateral etching according to claim 2, wherein said providing said first doped conductive layer comprises providing a hemispherical grained polysilicon.

4. The method of limiting enhanced lateral etching according to claim 2, wherein said providing said another doped conductive layer comprises providing a doped polysilicon.

5. A method for reducing cell plate leakage of a memory cell, comprising:
   providing a semiconductor substrate having an array of substantially isolated word lines disposed thereon, said word lines having active areas adjacent thereto, said active areas defining an array of FETs, said active areas being defined by first regions for electrical connection with a capacitor and second regions for electrical connection with a bit line;
   disposing a planarized insulating layer over said semiconductor substrate to cover said word lines and said active areas;
   creating contact openings through said planarized insulating layer to said first and second regions of said active areas;
   filling said contact openings with conductive material to form pillars, said pillars extending above said word lines;
   recessing said pillars in said first regions of said active areas to define capacitor contacts;
   disposing another insulating layer over said semiconductor substrate to cover said pillars, said capacitor contacts, and said planarized insulating layer;
   creating capacitor contact openings through said another insulating layer to electrically connect with said first regions of said active areas;
   disposing a layer of storage material atop said semiconductor substrate, said storage material lining said capacitor contact openings;
   selectively removing portions of said storage material from atop said another insulating layer to define storage node containers in electrical connection with said capacitor contacts;
   disposing a cell dielectric atop said semiconductor substrate;
   disposing a cell plate layer atop said cell dielectric;
   selectively removing portions of said cell dielectric and said cell plate layer to define an array of memory cell capacitors, said cell dielectric extending beyond said cell plate layer;
   disposing a TEOS barrier layer atop said semiconductor substrate;
   disposing a doped insulating layer atop said TEOS barrier layer;
   creating bit line contact openings through said doped insulating layer, said TEOS barrier layer, and said another insulating layer to said pillars; and
   disposing a digit line material atop said semiconductor substrate and within the bit line contact openings, said digit line material electrically connecting said pillars.

6. The method for reducing cell plate leakage of a memory cell according to claim 5, wherein said creating said bit line contact openings comprise etching with an anisotropic etch.

7. The method for reducing cell plate leakage of a memory cell according to claim 6, wherein said etching with said anisotropic etch comprises subsequent etching with a wet etch.

8. The method for reducing cell plate leakage of a memory cell according to claim 7, wherein said subsequent etching with said wet etch comprises etching with HF.

9. A method of reducing stress along a BPSG/nitride interface in a DRAM cell, comprising:
   providing a semiconductor substrate having an array of field effect transistors disposed thereon;
   creating first and second contact openings with first and second pillars disposed therein, said first and second contact openings abutting said field effect transistors;
   creating capacitor storage nodes within said first contact openings and extending to said first pillars;
   depositing a nitride layer atop said semiconductor substrate;
   depositing a cell plate layer atop said nitride layer;
   selectively etching said nitride layer and said cell plate layer to define a container capacitor structure, said nitride layer extending beyond said cell plate layer;
   depositing a TEOS layer atop said container capacitor structure;
   depositing a BPSG layer atop said TEOS layer;
   anisotropically etching bit line contacts through said BPSG layer and said TEOS layer; and
   wet etching said bit line contacts.

10. The method of reducing stress along a BPSG/nitride interface in a DRAM cell according to claim 9, wherein said creating said capacitor storage nodes comprises exposing edges of said capacitor storage nodes, said nitride layer and said cell plate layer; and wherein said depositing said TEOS layer comprises covering exposed edges of said capacitor storage nodes, said nitride layer, and said cell plate layer with said TEOS layer.

11. The method of reducing stress along a BPSG/nitride interface in a DRAM cell according to claim 9, wherein said depositing said cell plate layer comprises heavily doping said cell plate layer with dopants; and wherein said depositing said TEOS layer comprises separating said dopants from said BPSG layer.

12. The method of reducing stress along a BPSG/nitride interface in a DRAM cell according to claim 9, wherein said selective etching comprises damaging said nitride layer.

13. A method to prevent a short circuit between an upper capacitor cell plate and a conductive contact, comprising:
   providing a capacitor having lower and upper conductive cell plates, said conductive cell plates being separated by a dielectric, said conductive cell plates and said dielectric having edges;
   disposing a layer of TEOS about said capacitor, said TEOS layer encasing said edges of said conductive cell plates; and
   providing a conductive contact adjacent said capacitor, said TEOS layer separating said capacitor and said conductive contact and said edge of said dielectric is closer to said conductive contact than said edge of said upper conductive cell plate.

14. The method to prevent a short circuit between an upper capacitor cell plate and a conductive contact according to claim 13, wherein said providing said lower conductive cell plate comprises providing a doped hemispherical grained polysilicon and said providing said upper conductive cell plate comprises providing a doped polysilicon.

15. The method to prevent short circuits between an upper capacitor cell plate and a conductive contact according to claim 13, wherein said providing said edges of said lower conductive cell plate and said upper cell plate comprises forming said edge of said upper conductive cell plate closer to said conductive contact than said edge of said lower conductive cell plate.

16. The method to prevent a short circuit between an upper capacitor cell plate and a conductive contact according to claim 13, wherein said providing said capacitor comprises providing said capacitor in a container configuration.

17. The method to prevent a short circuit between an upper capacitor cell plate and a conductive contact according to claim 13, wherein said disposing said TEOS layer comprises conformally depositing said TEOS layer atop said capacitor.

18. A method of reducing stress along a BPSG/nitride interface in a DRAM cell, comprising:

provXiding a semiconductor substrate having an array of field effect transistors disposed thereon;

creating first and second contact openings with first and second pillars disposed therein, said first and second contact openings abutting said field effect transistors;

creating capacitor storage nodes within said first contact openings and extending to said first pillars;

depositing a nitride layer atop said semiconductor substrate;

depositing a cell plate layer atop said nitride layer;

selectively etching said nitride layer and said cell plate layer to define a container capacitor structure, said nitride layer extending beyond said cell plate layer, wherein said storage nodes, said nitride layer, and said cell plate layer include exposed edges;

depositing a TEOS layer atop said semiconductor substrate to cover said exposed edges;

depositing a BPSG layer atop said TEOS layer;

anisotropically etching bit line contacts through said BPSG layer and said TEOS layer; and wet etching said bit line contacts.

19. The method of reducing stress along a BPSG/nitride interface in a DRAM cell according to claim 18, wherein said depositing said cell plate layer comprises heavily doping said cell plage layer with dopants; and wherein said depositing said TEOS layer comprises separating said dopants from said BPSG layer.

20. The method of reducing stress along a BPSG/nitride interface in a DRAM cell according to claim 18, wherein said selective etching comprises damaging said nitride layer.

* * * * *

UNITED STATES PATENT AND TRADEMARK OFFICE
CERTIFICATE OF CORRECTION

PATENT NO. : 6,468,859 B1
DATED : October 22, 2002
INVENTOR(S) : Kunal R. Parekh, Charles H. Dennison and Jeffery W. Honeycutt It is certified that error appears in the above-identified patent and that said Letters Patent is hereby corrected as shown below:

Column 1,
Line 8, after "relates" and before "generally" delete "to"
Line 24, change "are" to -- is --
Line 61, after "wherein" delete "below"

Column 2,
Line 41, change "by reference numeral" to -- as a wafer --
Line 54, after "limited" change "to" to -- to, --
Line 61, after "caps" insert -- 18 -- and after "spacers" delete "18"

Column 3,
Line 21, change "glass" to -- Glass --
Line 29, before "layer" at the start of the line insert -- insulating --
Line 29, after "26" delete ","
Line 33, after "$O_2$" delete "and"
Line 36, change "an etch" to -- a selective etch --
Line 37, delete "selectively"
Line 39, change "26 and 24" to -- 24 and 26 --
Line 39, change "barrier" to -- the nitride or TEOS --
Line 41, change "BPSG" to -- first insulating -- and change "24 and 22" to -- 22 and 24 --
Line 44, change "contacts" to -- contact openings --
Lines 46-47 and 48, change "contacts" to -- contact --
Line 58, change "2000" to -- 2,000 --

Column 4,
Line 14, after "through" at the end of the line insert -- insulating --
Line 18, change "54," to -- 54 --
Line 19, after "conductive" insert -- material --
Line 20, after "comprises" and before "in situ" insert -- a storage node or storage container made from --
Lines 20 and 41, change "Phosphorous-doped" to -- phosphorous-doped --
Line 29, after "68" insert -- , such as a cell nitride layer, --
Line 32, delete "36" and delete "first"
Line 33, after "dielectric" insert -- layer --
Line 34, after "70" insert -- , such as cell plate, --
Line 40, change "Layer" to -- Cell layer --
Line 41, change "polysilicon," to -- polysilicon --
Line 43, change "Capacitor cell plate" to -- Cell --
Line 46, change "environment" to -- environment. --
Line 48, change "anti-reflective" to -- antireflective --
Line 50, change "Subsequently" to -- Subsequently, --

UNITED STATES PATENT AND TRADEMARK OFFICE
CERTIFICATE OF CORRECTION

PATENT NO.     : 6,468,859 B1
DATED          : October 22, 2002
INVENTOR(S)    : Kunal R. Parekh, Charles H. Dennison and Jeffery W. Honeycutt It is certified that error appears in the above-identified patent and that said Letters Patent is hereby corrected as shown below:

Column 5,
Line 15, change "plate" to -- layer --
Line 15, change "passed" to -- past --
Line 15, change "storage container polysilicon" to -- conductive material layer --
Line 16, change "low level" to -- low-level --
Line 17, change "storage node" to -- conductive material layer --
Line 17, delete "plate"
Line 18, change "exposed" to -- misalignment --
Line 19, change "lead" to -- leads --
Line 21, change "nitride" to -- dielectric layer --
Line 22, change "etched region 73" to -- misalignment edge 73 or region --
Line 25, delete "capacitor"
Line 26, change "1500" to -- 1,500 --
Line 28, change "storage container polysilicon" to -- conductive material layer --
Line 29, after "damaged" and before "nitride" insert -- cell --
Line 30, after "film" and before "76" insert -- or layer --
Line 31, change "it, and" to -- it and, --
Line 33, after "flow," insert -- Figure 10 illustrates --
Line 34, change "overlays" to -- overlaying --
Line 34, change "barrier layer 76" to -- electrically insulative layer 76 or barrier layer --
Line 35, change "Layer" to -- The insulating material --
Line 36, change "BPSG" to -- a BPSG layer 78 --
Line 37, after "BPSG" insert -- layer 78 --
Line 40, change "Referring to Figure 10, preliminary" to -- Preliminary --
Line 41, after "overlying" and before "layer" insert -- BPSG -- and after "78," delete "and"
Lines 42-43, change "polysilicon plug" to -- pillar --
Line 48, after "BPSG" insert -- layer 78 --
Line 52, change "plate" to -- layer -- and after "etched" delete ","
Line 54, change "nitride" to -- cell nitride layer -- and after "BPSG" insert -- layer --
Line 55, change "film" to -- layer --
Line 57, after "nitride" insert -- layer --
Line 58, after "along" insert "the" and after "BPSG" insert -- layer --

Column 6,
Line 1, change "polysilicon" to -- layer --
Line 2, change "plate" to -- layer --
Line 5, change "contact to cell plate" to -- contact-to-cell layer --
Line 9, change "polycrystalline silicon" to -- layer --
Line 13, after "the" and before "layer" insert -- TEOS --
Line 15, change "plate" to -- layer --

UNITED STATES PATENT AND TRADEMARK OFFICE
CERTIFICATE OF CORRECTION

PATENT NO. : 6,468,859 B1
DATED : October 22, 2002
INVENTOR(S) : Kunal R. Parekh, Charles H. Dennison and Jeffery W. Honeycutt It is certified that error appears in the above-identified patent and that said Letters Patent is hereby corrected as shown below:

<u>Column 6 (cont'd),</u>
Line 19, change "plate" to -- layer -- and change "glass" to -- layer --
Line 19, change "78, and therefore" to -- 78 and, therefore, --
Line 20, change "stress induced" to -- stress-induced --
Line 21, after "along" insert -- the --
Line 22, change "contact to cell plate" to -- contact-to-cell layer --
Line 26, delete "first"
Line 27, change "regions" to -- region --
Line 30, change "herein before" to -- hereinbefore --

Signed and Sealed this

Fourth Day of November, 2003

JAMES E. ROGAN
*Director of the United States Patent and Trademark Office*